United States Patent
Okawara et al.

(10) Patent No.: US 7,359,251 B2
(45) Date of Patent: Apr. 15, 2008

(54) NON-VOLATILE SEMICONDUCTOR MEMORY DEVICE, ERASE METHOD FOR SAME, AND TEST METHOD FOR SAME

(75) Inventors: Junko Okawara, Kawasaki (JP); Mitsuharu Sakakibara, Kawasaki (JP); Naoto Emi, Kawasaki (JP); Tomoharu Sohma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 23 days.

(21) Appl. No.: 11/518,207

(22) Filed: Sep. 11, 2006

(65) Prior Publication Data

US 2007/0274131 A1  Nov. 29, 2007

(30) Foreign Application Priority Data

May 24, 2006 (JP) ............................. 2006-144224

(51) Int. Cl.
  *G11C 11/34* (2006.01)
  *G11C 16/06* (2006.01)
(52) U.S. Cl. ........................... 365/185.29; 365/185.18; 365/195; 365/218
(58) Field of Classification Search ........... 365/185.18, 365/185.29, 195, 218, 201
  See application file for complete search history.

(56) References Cited

U.S. PATENT DOCUMENTS

| | | |
|---|---|---|
| 5,414,664 A | 5/1995 | Lin et al. |
| 5,596,530 A | 1/1997 | Lin et al. |
| 6,198,657 B1 * | 3/2001 | Uekubo et al. ........ 365/185.04 |
| 6,496,417 B1 * | 12/2002 | Shiau et al. ............. 365/185.2 |

FOREIGN PATENT DOCUMENTS

| | | |
|---|---|---|
| JP | 08-031189 A | 2/1996 |
| JP | 2004-241045 A | 8/2004 |

* cited by examiner

*Primary Examiner*—Anh Phung
*Assistant Examiner*—Toan Le
(74) *Attorney, Agent, or Firm*—Arent Fox LLP (57) ABSTRACT

A non-volatile semiconductor memory device includes a memory cell array and an operation control circuit. The memory cell array includes a plurality of non-volatile memory cells that are electrically rewritable. The operation control circuit controls an operation of the memory cell array in accordance with an external instruction. The operation control circuit includes a flag circuit and an erase prohibition circuit. The flag circuit is set when erase incompletion is detected from any of the memory cells by an erase verify operation of the memory cell array. The erase prohibition circuit prohibits an erase operation to the memory cell array irrespective of the external instruction when the flag circuit is in a reset state.

10 Claims, 8 Drawing Sheets

NON-VOLATILE SEMICONDUCTOR MEMORY DEVICE, ERASE METHOD FOR SAME, AND TEST METHOD FOR SAME

CROSS REFERENCE TO RELATED APPLICATION

This application is based upon and claims the benefit of priority from Japanese Patent Application No. 2006-144224, filed on May 24, 2006, the entire contents of which are incorporated herein by reference.

BACKGROUND OF THE INVENTION

1. Field of the Invention

The present invention relates to a non-volatile semiconductor memory device, and more particularly, to a technique to test a non-volatile semiconductor memory device.

2. Description of the Related Art

Figure 1:
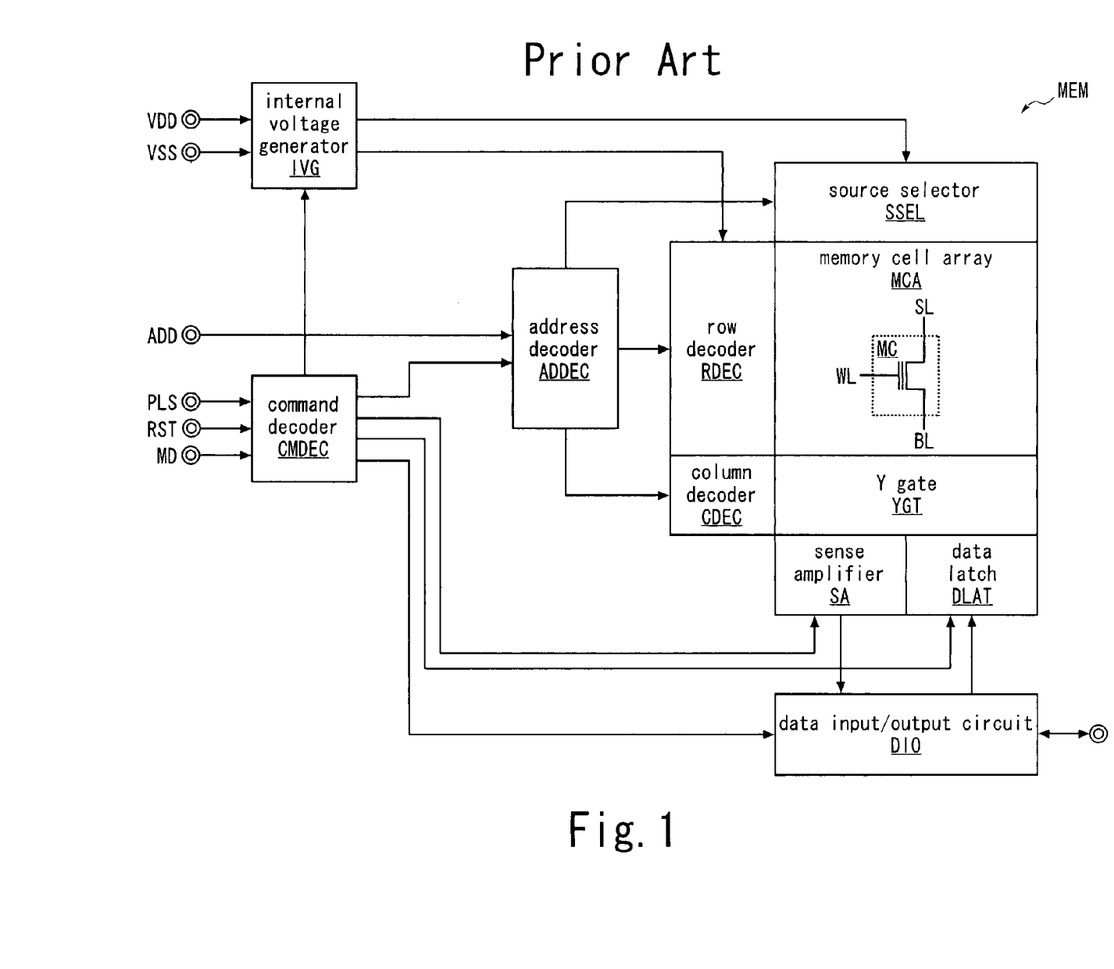
FIG. 1 is a block diagram showing a conventional non-volatile semiconductor memory device.

FIG. 1 shows a conventional non-volatile semiconductor memory device. A conventional non-volatile semiconductor memory device MEM has a command decoder CMDEC, an internal voltage generator IVG, an address decoder ADDEC, a memory cell array MCA, a row decoder RDEC, a source selector SSEL, a column decoder CDEC, a Y gate YGT, a sense amplifier SA, a data latch DLAT, and a data input/output circuit DIO.

Based on external control signals supplied via a pulse input pin PLS, a reset pin RST, and a mode set pin MD, the command decoder CMDEC shifts to a desired operation mode (a read operation mode, a write operation mode, an erase operation mode, or the like) to generate internal control signals (including a read command, a write command, an erase command, and the like) for controlling the internal voltage generator IVG, the address decoder ADDEC, the sense amplifier SA, the data latch DLAT, and the data input/output circuit DIO.

In response to the internal control signal supplied from the command decoder CMDEC, the internal voltage generator IVG generates an internal voltage to be used in the row decoder RDEC and an internal voltage to be used in the source selector SSEL by using external voltages supplied via power supply pins VDD, VSS. The address decoder ADDEC generates internal control signals for controlling the row decoder RDEC, the source selector SSEL, and the column decoder CDEC, based on an address supplied via an address input pin ADD and the internal control signal supplied from the command decoder CMDEC.

The memory cell array MCA is composed of a plurality of non-volatile memory cells MC arranged in matrix. Each of the memory cells MC is constituted of a transistor having a control gate and a floating gate. The control gate of the memory cell MC is connected to a word line WL, a drain of the memory cell MC is connected to a bit line BL, and a source of the memory cell MC is connected to a source line SL.

The row decoder RDEC selects a desired word line WL in the memory cell array MCA based on the internal control signal supplied from the address decoder ADDEC and sets the selected word line WL to a predetermined voltage by using the internal voltage supplied from the internal voltage generator IVG. The source selector SSEL selects a desired source line SL in the memory cell array MCA based on the internal control signal supplied from the address decoder ADDEC and sets the selected source line SL to a predetermined voltage by using the internal voltage supplied from the internal voltage generator IVG.

The column decoder CDEC generates an internal control signal for controlling the Y gate YGT based on the internal control signal supplied from the address decoder ADDEC. The Y gate YGT selects a desired bit line BL in the memory cell array MCA based on the internal control signal supplied from the column decoder CDEC and connects the selected bit line BL to the sense amplifier SA or the data latch DLAT. The sense amplifier SA, the data latch DLAT, and the data input/output circuit DIO are generally-known circuits that operate in response to the internal control signals supplied from the command decoder CMDEC, for the purpose of data exchange and so on between the memory cell array MCA and an exterior, and the like.

In the non-volatile semiconductor memory device MEM as structured above, an erase operation is executed by applying an electric field for discharging electrons from the gate of the memory cell MC selected by the row decoder RDEC and the source selector SSEL. Whether or not the erase of the memory cell MC has been completed is determined by an erase verify operation. The erase verify operation is executed in such a manner that an electric current of the memory cell MC selected by the row decoder RDEC and the source selector SSEL passes through the bit line BL, and the sense amplifier SA determines the erase completion via the Y gate YGT. The determination result by the sense amplifier SA is supplied to an input/output pin IO via the data input/output circuit DIO.

When an erase voltage (voltage of the word line WL for the erase operation) is excessively applied to the memory cell MC, a threshold voltage of the memory cell MC becomes negative (the memory cell MC comes to be in an over-erased state). If there is a memory cell MC in the over-erased state, an electric current of the memory cell MC in the over-erased state passes through the bit line BL in the read operation and the like. As a result, the sense amplifier SA cannot discriminate an electric current of a memory cell MC in a programmed state from the electric current of the memory cell MC in the over-erased state both connected to the same bit line BL, which may cause erroneous data read. Therefore, it is necessary to avoid applying an excessive erase voltage to the memory cells MC.

Figure 2:
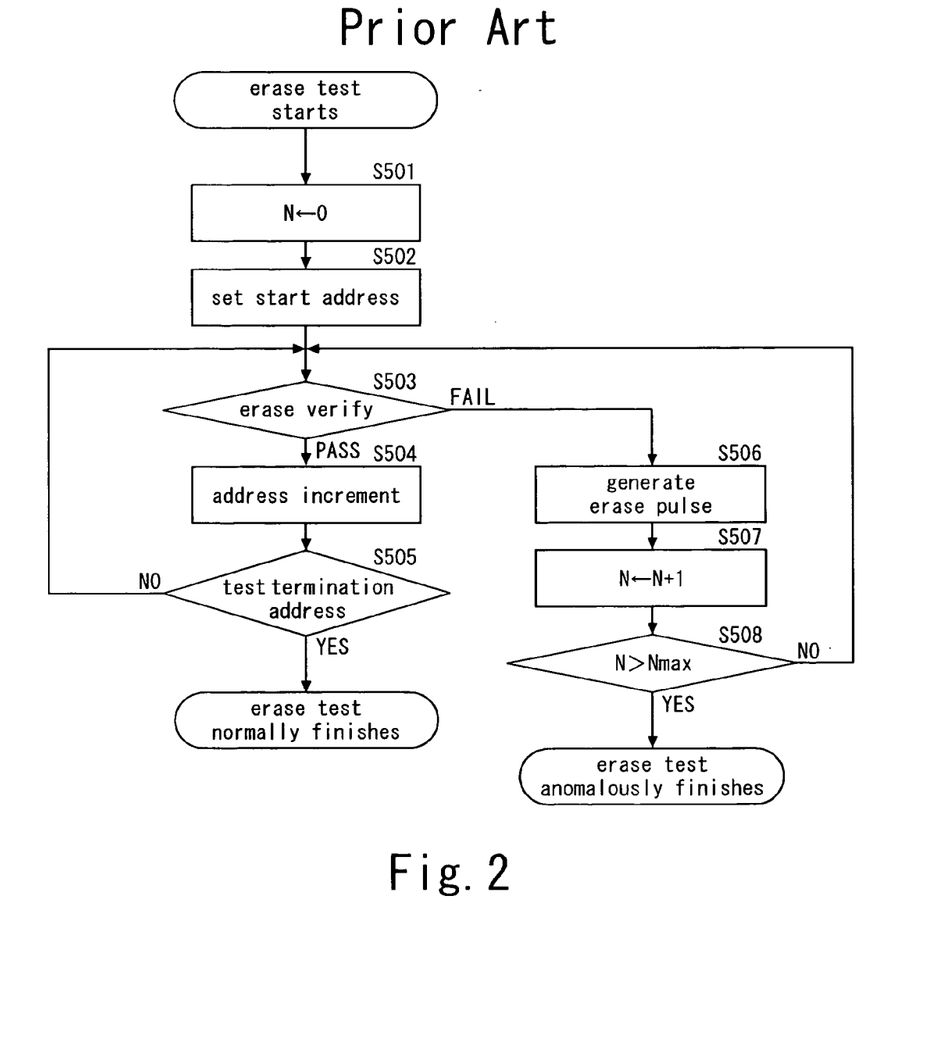
FIG. 2 is a flowchart showing an erase test method for the non-volatile semiconductor memory device in FIG. 1.

FIG. 2 shows an erase test method for the non-volatile semiconductor memory device in FIG. 1. In an erase test flow shown in FIG. 2, Steps S501~S508 are operations executed in an external testing apparatus.

At Step S501, a value of a variable N representing the number of erase times (the number of times an erase pulse is generated) is set to 0. Thereafter, the erase test shifts to Step S502.

At Step S502, an address supplied to the address input pin ADD is set to a start address of the memory cell array MCA. Thereafter, the erase test shifts to Step S503.

At Step S503, the erase verify is executed. If the erase verify results in pass determination, the erase test shifts to Step S504. If the erase verify results in fail determination, the erase test shifts to Step S506.

At Step S504, the address supplied to the address input pin ADD is incremented. Thereafter, the erase test shifts to Step S505.

At Step S505, it is determined whether or not the address supplied to the address input pin ADD matches a test termination address (an address after an end address of the memory cell array MCA is incremented). If the address supplied to the address input pin ADD matches the test termination address, the erase test is normally finished. If the address supplied to the address input pin ADD does not match the test termination address, the erase test shifts to Step S503.

At Step S506, the erase pulse to be supplied to the pulse input pin PLS is generated. Consequently, the erase operation of the non-volatile semiconductor memory device MEM is executed. Thereafter, the erase test shifts to Step S507.

At Step S507, 1 is added to the value of the variable N. Thereafter, the erase test shifts to Step S508.

At Step S508, it is determined whether or not the value of the variable N has exceeded a maximum number of erase times Nmax. If the value of the variable N has exceeded the maximum number of erase times Nmax, the erase test is anomalously finished. If the value of the variable N has not exceeded the maximum number of erase times Nmax, the erase test shifts to Step S503.

Further, Japanese Unexamined Patent Application Publication No. Hei 8-31189 and Japanese Unexamined Patent Application Publication No. 2004-241045 disclose, for example, a technique to simultaneously conduct erase tests on a plurality of non-volatile semiconductor memory device.

In erase tests of non-volatile semiconductor memory devices such as flash memories, generally, plural non-volatile semiconductor memory devices are subjected to the erase tests simultaneously in order to shorten the test time. In conducting the erase tests on a plurality of non-volatile semiconductor memory devices that are different in the number of erase times (the time taken to complete the erase of all the memory cells) by using simple external testing apparatuses having the same power source, an external control signal for causing the non-volatile semiconductor memory devices to execute the erase operation is supplied commonly to all of the plural non-volatile semiconductor memory devices. Because of this, the external control signal is continuously supplied to all of the non-volatile semiconductor memory devices as long as there remains any non-volatile semiconductor memory device with the erase of all the memory cells not completed. Consequently, erase operations are executed more than necessary even on the non-volatile semiconductor memory devices with the erase of all the memory cells completed.

The number of erase times required for completing the erase of all memory cells in a non-volatile semiconductor memory device (the number of times the erase operation is executed) is greatly influenced by manufacturing conditions and the like of the non-volatile semiconductor memory device. Therefore, in a case where the erase tests are conducted on a plurality of non-volatile semiconductor memory devices simultaneously according to the erase test flow shown in FIG. 2, when an anomalous termination condition (the maximum number of erase times Nmax) of the erase test flow is set for one which requires the largest number of erase times, unnecessary erase pulses are supplied to the other non-volatile semiconductor memory devices, resulting in the execution of erase operations more than necessary.

Further, Japanese Unexamined Patent Application Publication No. Hei 8-31189 discloses a method in which conditional branch processing is executed for each memory cell in each of the non-volatile semiconductor memory devices by hardware and software of the external testing apparatus. However, this complicates the configuration of the external testing apparatus. Japanese Unexamined Patent Application Publication No. 2004-241045 discloses another method in which the erase pulse is continuously supplied until the prescribed maximum number of erase times, which makes the test time fixed and makes the shortening thereof difficult accordingly.

SUMMARY OF THE INVENTION

It is an object of the present invention to prevent execution of unnecessary erase operations in each non-volatile semiconductor memory device when conducting erase tests on a plurality of non-volatile semiconductor memory devices simultaneously.

According to one aspect of the present invention, a non-volatile semiconductor memory device has a memory cell array and an operation control circuit. The memory cell array includes a plurality of non-volatile memory cells that are electrically rewritable. The operation control circuit controls an operation of the memory cell array in accordance with an external instruction. The operation control circuit includes a flag circuit and an erase prohibition circuit. The flag circuit is set when erase incompletion is detected from any of the memory cells by an erase verify operation of the memory cell array. For example, the flag circuit is reset before the erase verify operation of the memory cell array is started. The erase prohibition circuit prohibits the erase operation to the memory cell array irrespective of the external instruction when the flag circuit is in a reset state. That is, after the erase completion is detected from all the memory cells by the erase verify operation of the memory cell array, the erase operation to the memory cell array is prohibited irrespective of the external instruction.

Preferably, the operation control circuit includes a command output circuit functioning as the erase prohibition circuit. The command output circuit outputs an erase command to instruct the erase operation to the memory cell array, only when the flag circuit is in a set state. That is, the erase command is outputted only when erase incompletion is detected from any of the memory cells by the erase verify operation of the memory cell array.

Alternatively, the operation control circuit includes a voltage generating circuit functioning as the erase prohibition circuit. The voltage generating circuit generates an erase voltage to be used in the erase operation of the memory cell array, only when the flag circuit is in a set state. That is, the erase voltage is generated only when erase incompletion is detected from any of the memory cells by the erase verify operation of the memory cell array.

Alternatively, the operation control circuit includes a voltage applying circuit functioning as the erase prohibition circuit. The voltage applying circuit applies an erase voltage to control gates of the memory cells only when the flag circuit is in a set state. That is, the erase voltage is applied to the control gates of the memory cells only when erase incompletion is detected from any of the memory cells by the erase verify operation of the memory cell array.

The non-volatile semiconductor memory device as described above is provided with the flag circuit that is set when the erase verify operation results in fail determination, and the erase prohibition circuit that prohibits the erase operation when the flag circuit is not in the set state, so that in a case where the erase tests are simultaneously conducted on plural non-volatile semiconductor devices, in each of the non-volatile semiconductor memory devices the erase operation of the memory cell array is prohibited irrespective of the external instruction after the erase completion is detected from all the memory cells by the erase verify operation of the memory cell array. Consequently, even at the simultaneous erase tests on the plurality of non-volatile semiconductor memory devices, the erase operation is not executed on the non-volatile semiconductor memory device in which the erase of all the memory cells is completed. Therefore, it is possible to prevent the execution of unnecessary erase operations in each of the non-volatile semiconductor memory devices in the simultaneous erase tests on the plurality of non-volatile semiconductor memory devices.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 3:
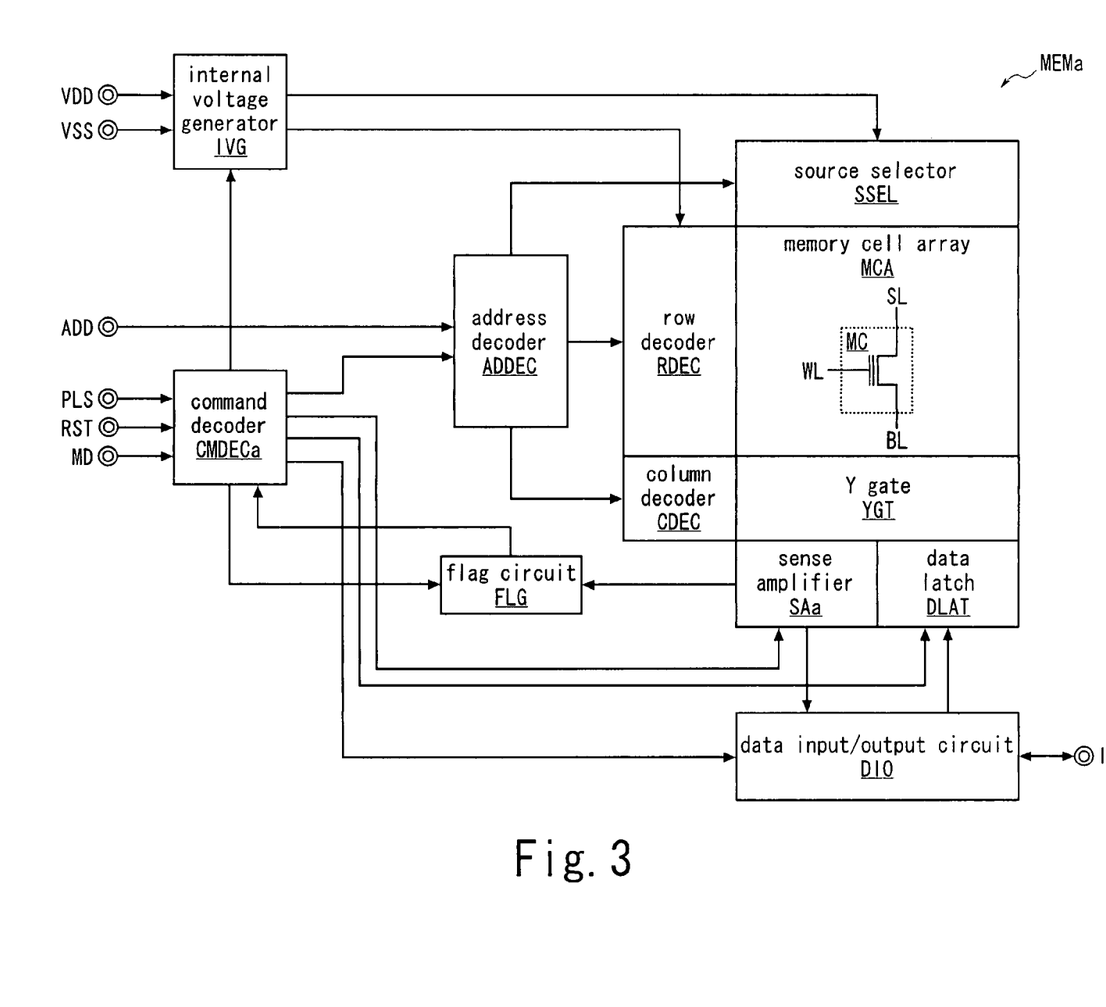
FIG. 3 is a block diagram showing a non-volatile semiconductor memory device of a first embodiment of the present invention.

Hereinafter, embodiments of the present invention will be described by using the drawings. FIG. 3 shows a non-volatile semiconductor memory device of a first embodiment of the present invention. In describing FIG. 3, the same reference symbols are used to designate the same elements as the elements described in FIG. 1, and detailed description thereof will be omitted. A non-volatile semiconductor memory device MEMa in FIG. 3 is structured such that in the non-volatile semiconductor memory device MEM in FIG. 1, a flag circuit FLG is added and the command decoder CMDEC and the sense amplifier SA are replaced by a command decoder CMDECa and a sense amplifier SAa respectively.

The command decoder CMDECa in FIG. 3 is the same as the command decoder CMDEC in FIG. 1 except in that it shifts to an erase operation mode to output an erase command (a command for instructing the execution of an erase operation of the memory cell array MCA) only when the flag circuit FLG is in a set state, and generates an internal control signal for resetting the flag circuit FLG before an erase verify operation of the memory cell array MCA is executed.

The sense amplifier SAa in FIG. 3 is the same as the sense amplifier SA in FIG. 1 except in that it supplies a pass/fail determination result in the erase verify operation of the memory cell array MCA also to the flag circuit FLG. The flag circuit FLG is set when the determination result supplied from the sense amplifier SAa indicates fail. Further, the flag circuit FLG is reset in response to the internal control signal supplied from the command decoder CMDECa.

Figure 4:
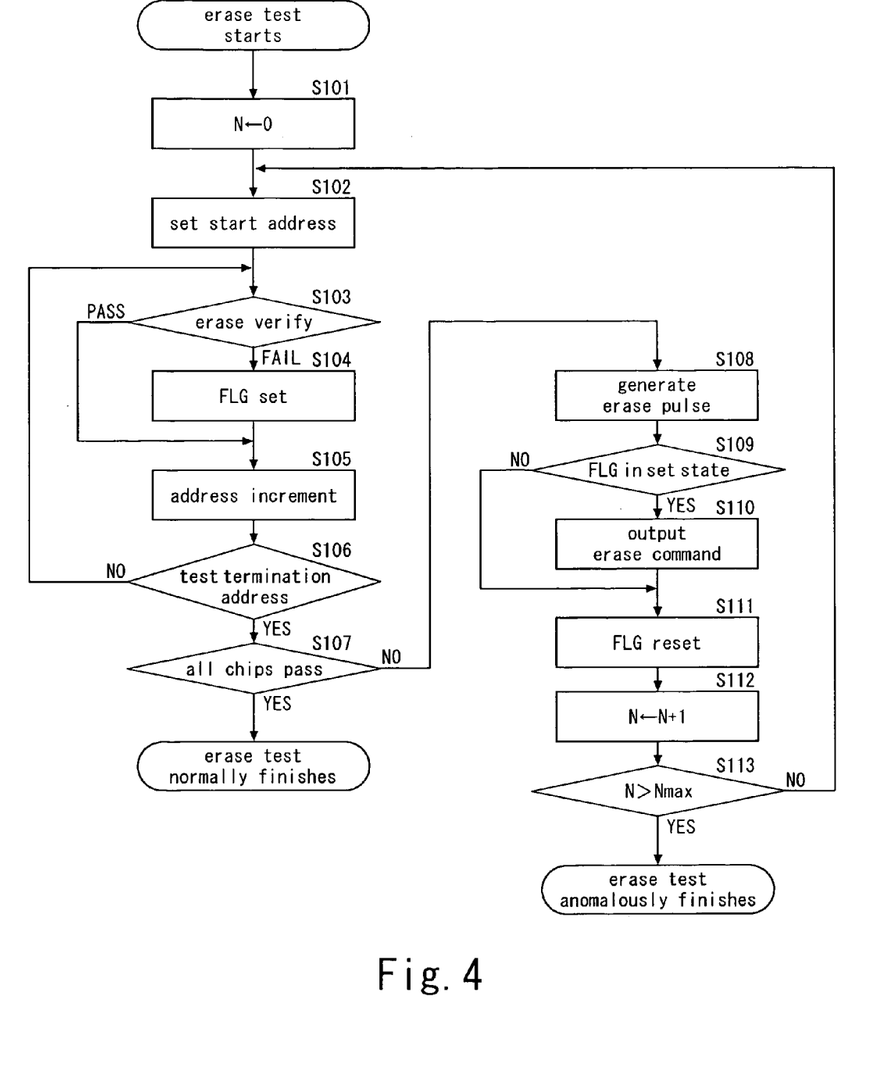
FIG. 4 is a flowchart showing an erase test method for the non-volatile semiconductor memory device shown in FIG. 3 (simultaneous testing on the plural devices)

FIG. 4 shows an erase test method for the non-volatile semiconductor memory device in FIG. 3 (simultaneous testing on the plural devices). In an erase test flow shown in FIG. 4, Steps S103, S104, and S109~S111 are operations executed in each of the non-volatile semiconductor memory devices MEMa, and steps other than Steps S103, S104, and S109~S111 are operations executed in an external testing apparatus.

At Step S101, a value of a variable N representing the number of erase times (the number of times an erase pulse is generated) is set to 0. Thereafter, the erase test shifts to Step S102.

At Step S102, an address supplied to an address input pin ADD is set to a start address of the memory cell array MCA. Thereafter, the erase test shifts to Step S103.

At Step S103, erase verify is executed. If the erase verify results in pass determination, the erase test skips Step S104 to shift to Step S105. If the erase verify results in fail determination, the erase test shifts to Step S104.

At Step S104, the flag circuit FLG is set. Thereafter, the erase test shifts to Step S105.

At Step S105, the address supplied to the address input pin ADD is incremented. Thereafter, the erase test shifts to Step S106.

At Step S106, it is determined whether or not the address supplied to the address input pin ADD matches a test termination address (an address after an end address of the memory cell array MCA is incremented). If the address supplied to the address input pin ADD matches the test termination address, the erase test shifts to Step S107. If the address supplied to the address input pin ADD does not match the test termination address, the erase test shifts to Step S103.

At Step S107, it is determined whether or not the erase verify for all addresses in all chips (non-volatile semiconductor memory devices MEMa) has resulted in pass determination.

If the erase verify for all the addresses in all the chips has resulted in the pass determination, the erase test is normally finished. If the erase verify for at least one of the addresses in at least one of the chips has resulted in fail determination, the erase test shifts to Step S108.

At Step S108, the erase pulse to be supplied to a pulse input pin PLS is generated. Thereafter, the erase test shifts to Step S109.

At Step S109, it is determined whether or not the flag circuit FLG is in a set state. If the flag circuit FLG is in the set state, the erase test shifts to Step S110. If the flag circuit FLG is not in the set state (if the flag circuit FLG is in a reset state), the erase test skips Step S110 to shift to Step S111.

At Step S110, since the flag circuit FLG is in the set state, the command decoder CMDECa outputs the erase command, so that an erase operation of the memory cell array MCA is executed. Thereafter, the erase test shifts to Step S111.

At Step S111, the flag circuit FLG is reset. Thereafter, the erase test shifts to Step S112.

At Step S112, 1 is added to the value of the variable N. Thereafter, the erase test shifts to Step S113.

At Step S113, it is determined whether or not the value of the variable N has exceeded a maximum number of erase times Nmax. If the value of the variable N has exceeded the maximum number of erase times Nmax, the erase test is anomalously finished. If the value of the variable N has not exceeded the maximum number of erase times Nmax, the erase test shifts to Step S102.

In the first embodiment as described above, the flag circuit FLG is set in accordance with the fail determination in the erase verify operation, and the command decoder CMDECa outputs the erase command only when the flag circuit FLG is in the set state, and therefore, even in a case where the erase tests of the plural non-volatile semiconductor memory devices MEMa are simultaneously conducted, the erase operation is not executed in the non-volatile semiconductor memory device MEMa in which the erase of all the memory cells MC has been completed. Therefore, in a case where the erase tests of the plural non-volatile semiconductor memory devices MEMa are simultaneously conducted, it is possible to prevent the execution of more erase operations than necessary in each of the non-volatile semiconductor memory devices MEMa.

Moreover, in a case where the erase tests of n pieces of the non-volatile semiconductor memory devices MEMa are simultaneously conducted, a test time T is expressed as T=(T1+T2)×N, where T1 is the time taken for the erase verify operation for all the addresses, T2 is the time taken for one erase operation, and N is the number of times the erase pulse is generated until the erase is completed in all the non-volatile semiconductor memory devices MEMa, and the time T is equal to the time taken for the erase test of one non-volatile semiconductor memory device MEMa. Therefore, in a case where the erase tests of the plural non-volatile semiconductor memory devices MEMa are simultaneously conducted, the test time can be shortened.

Figure 5:
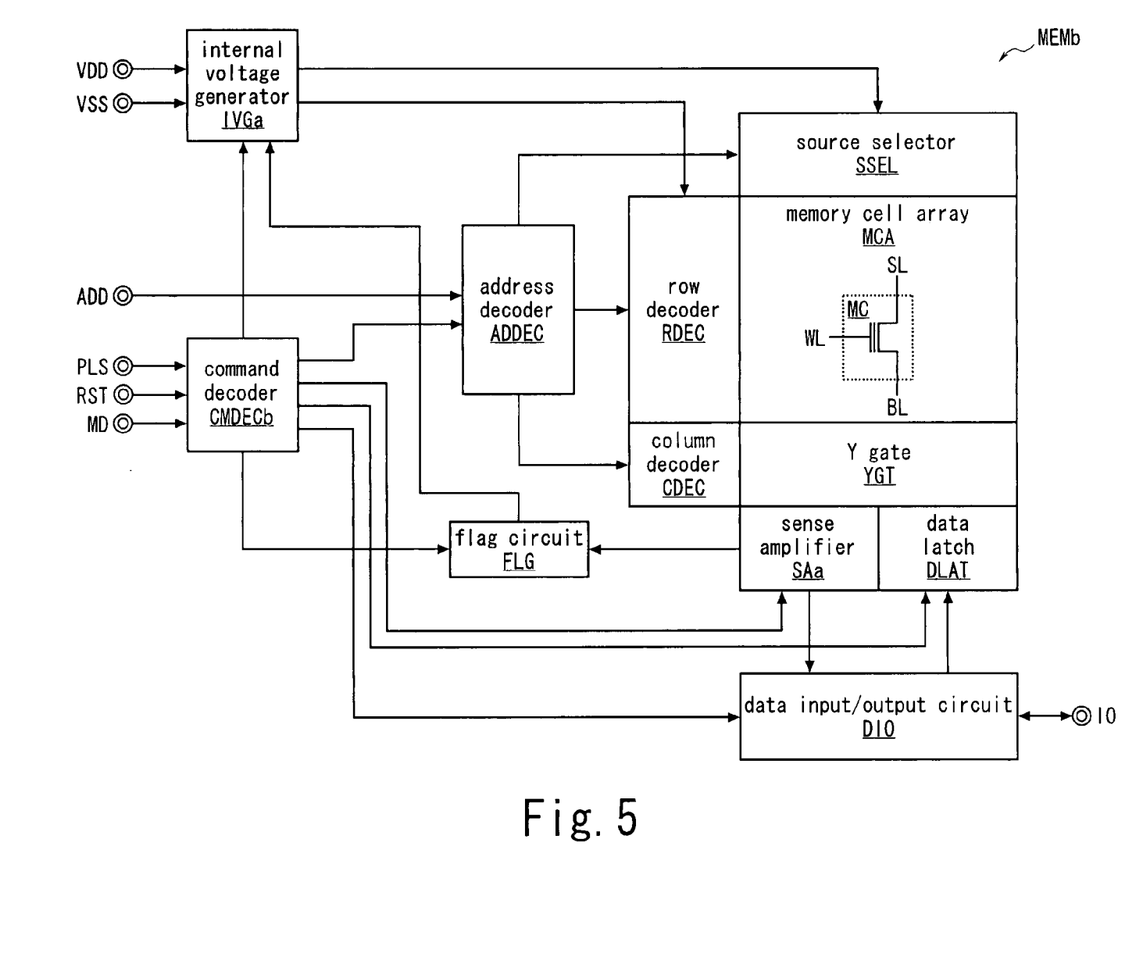
FIG. 5 is a block diagram showing a non-volatile semiconductor memory device of a second embodiment of the present invention.

FIG. 5 shows a non-volatile semiconductor memory device of a second embodiment of the present invention. In describing FIG. 5, the same reference symbols are used to designate the same elements as the elements described in FIG. 1 and FIG. 3, and detailed description thereof will be omitted. A non-volatile semiconductor memory device MEMb in FIG. 5 is structured such that in the non-volatile semiconductor memory device MEMa in FIG. 3, the command decoder CMDECa and the internal voltage generator IVG are replaced by a command decoder CMDECb and an internal voltage generator IVGa respectively.

The command decoder CMDECb in FIG. 5 is the same as the command decoder CMDECa in FIG. 3 except in that it outputs an erase command irrespective of a set state/reset state of a flag circuit FLG. The internal voltage generator IVGa in FIG. 5 is the same as the internal voltage generator IVG in FIG. 3. (FIG. 1) except in that it generates an internal voltage to be used in a row decoder RDEC only when the flag circuit FLG is in the set state.

Figure 6:
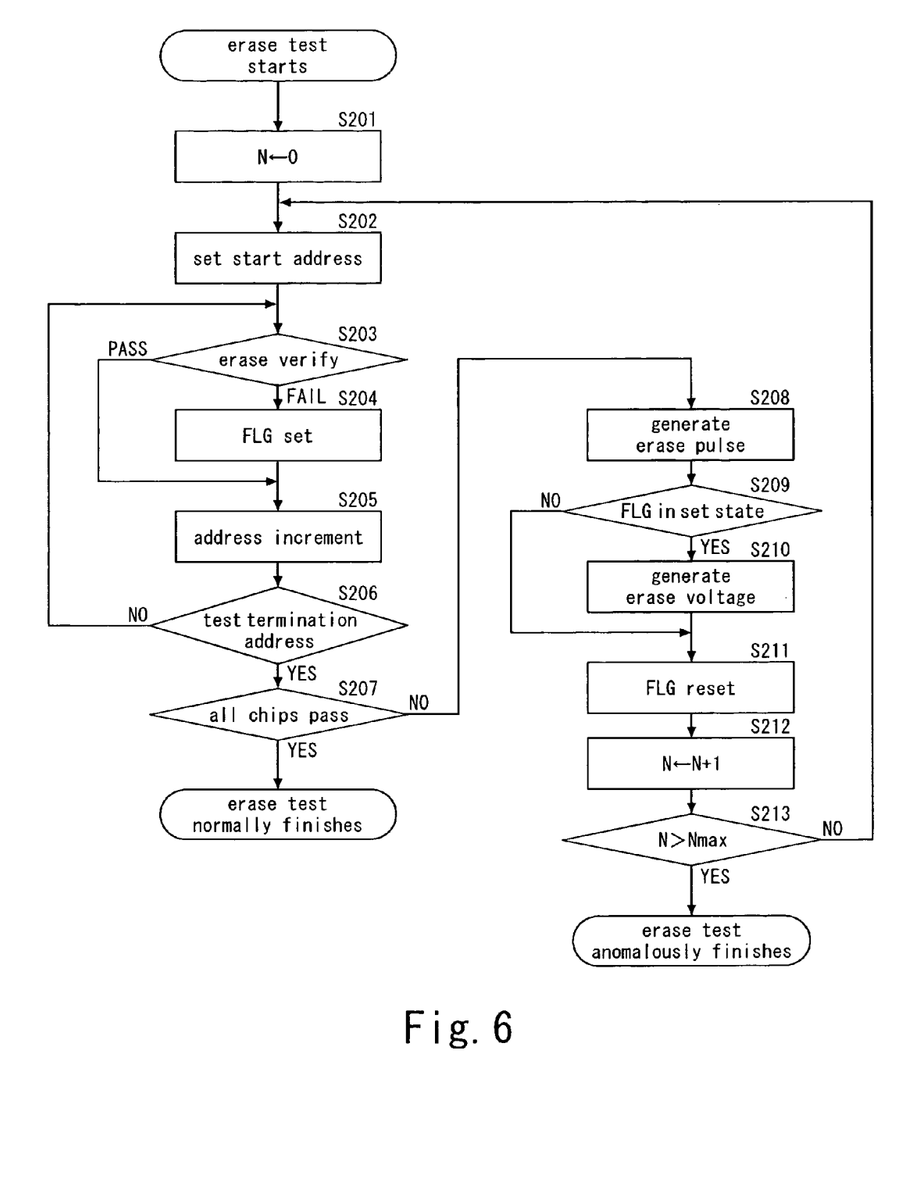
FIG. 6 is a flowchart showing an erase test method for the non-volatile semiconductor memory device in FIG. 5 (simultaneous testing on the plural devices)

FIG. 6 shows an erase test method for the non-volatile semiconductor memory device in FIG. 5 (simultaneous testing on the plural devices). In an erase test flow shown in FIG. 6, Steps S203, S204, and S209~S211 are operations executed in each of the non-volatile semiconductor memory devices MEMb, and steps other than Steps S203, S204, and S209~S211 are operations executed in an external testing apparatus.

At Step S201, a value of a variable N representing the number of erase times (the number of times an erase pulse is generated) is set to 0. Thereafter, the erase test shifts to Step S202.

At Step S202, an address supplied to an address input pin ADD is set to a start address of a memory cell array MCA. Thereafter, the erase test shifts to Step S203.

At Step S203, erase verify is executed. If the erase verify results in pass determination, the erase test skips Step S204 to shift to Step S205. If the erase verify results in fail determination, the erase test shifts to Step S204.

At Step S204, the flag circuit FLG is set. Thereafter, the erase test shifts to Step S205.

At Step S205, the address supplied to the address input pin ADD is incremented. Thereafter, the erase test shifts to Step S206.

At Step S206, it is determined whether or not the address supplied to the address input pin ADD matches a test termination address (an address after an end address of the memory cell array MCA is incremented). If the address supplied to the address input pin ADD matches the test termination address, the erase test shifts to Step S207. If the address supplied to the address input pin ADD does not match the test termination address, the erase test shifts to Step S203.

At Step S207, it is determined whether or not the erase verify for all addresses in all chips (non-volatile semiconductor memory devices MEMb) has resulted in pass determination. If the erase verify for all the addresses in all the chips has resulted in the pass determination, the erase test is normally finished. If the erase verify for at least one of the addresses in at least one of the chips has resulted in fail determination, the erase test shifts to Step S208.

At Step S208, the erase pulse to be supplied to a pulse input pin PLS is generated. Thereafter, the erase test shifts to Step S209.

At Step S209, it is determined whether or not the flag circuit FLG is in the set state. If the flag circuit FLG is in the set state, the erase test shifts to Step S210. If the flag circuit FLG is not in the set state (if the flag circuit FLG is in the reset state), the erase test skips Step S210 to shift to Step S211.

At Step S210, since the flag circuit FLG is in the set state, the internal voltage generator IVGa generates an erase voltage (the internal voltage to be used in the row decoder RDEC, so that an erase operation of the memory cell array MCA is executed. Thereafter, the erase test shifts to Step S211.

At Step S211, the flag circuit FLG is reset. Thereafter, the erase test shifts to Step S212.

At Step S212, 1 is added to the value of the variable N. Thereafter, the erase test shifts to Step S213.

At Step S213, it is determined whether or not the value of the variable N has exceeded a maximum number of erase times Nmax. If the value of the variable N has exceeded the maximum number of erase times Nmax, the erase test is anomalously finished. If the value of the variable N has not exceeded the maximum number of erase times Nmax, the erase test shifts to Step S202.

The second embodiment as described above can also provide the same effects as those of the first embodiment.

Figure 7:
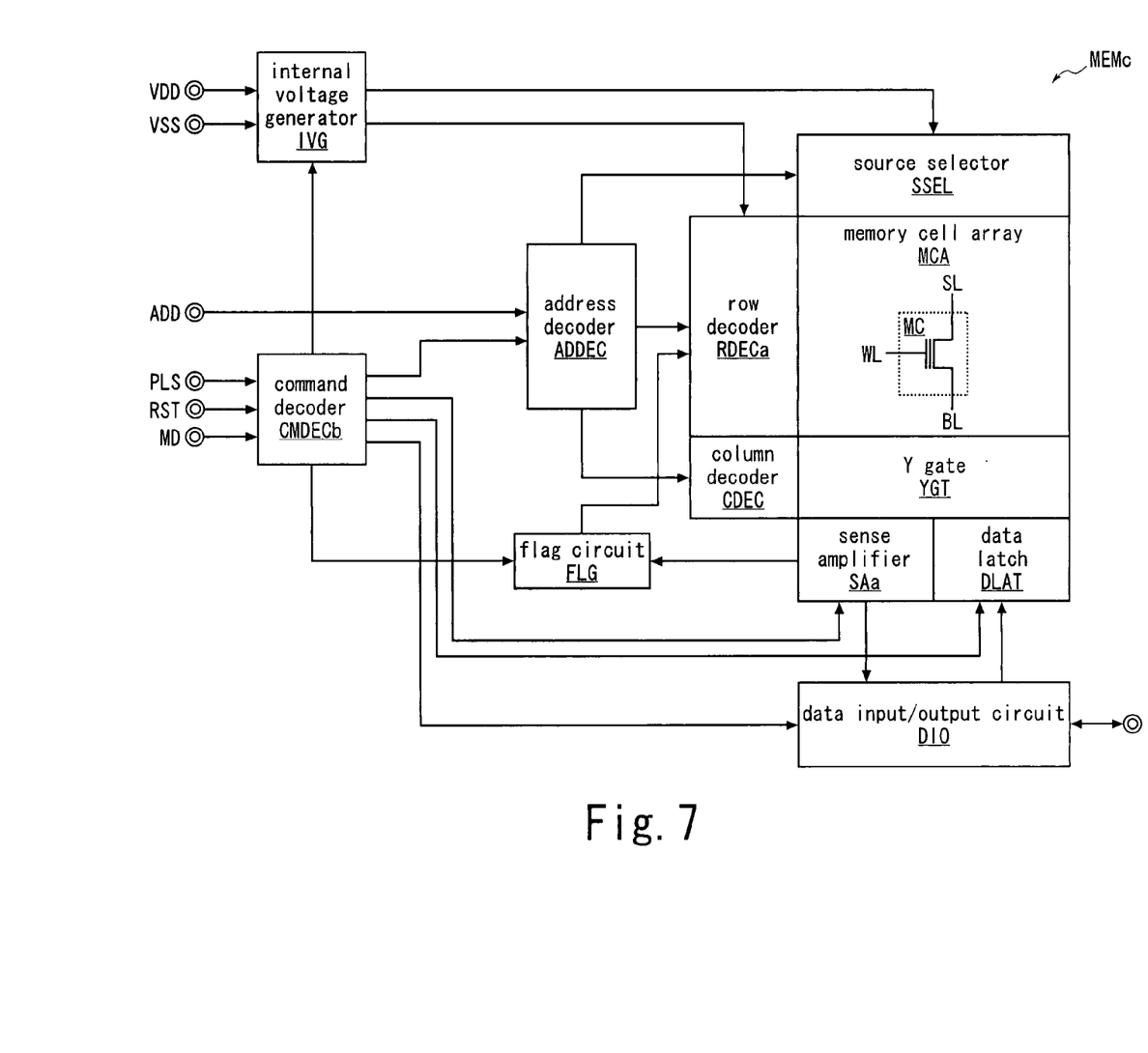
FIG. 7 is a block diagram showing a non-volatile semiconductor memory device of a third embodiment of the present invention.

FIG. 7 shows a non-volatile semiconductor memory device of a third embodiment of the present invention. In describing FIG. 7, the same reference symbols are used to designate the same elements as the elements described in FIG. 1, FIG. 3, and FIG. 5, and detailed description thereof will be omitted. A non-volatile semiconductor memory device MEMc in FIG. 7 is structured such that in the non-volatile semiconductor memory device MEMa in FIG. 3, the command decoder CMDECa and the row decoder RDEC are replaced by the command decoder CMDECb (FIG. 5) and a row decoder RDECa respectively.

The row decoder RDECa in FIG. 7 is the same as the row decoder RDEC in FIG. 3 (FIG. 1) except in that it sets a word line WL to a predetermined voltage by using an internal voltage supplied from an internal voltage generator IVG only when a flag circuit FLG is in a set state.

Figure 8:
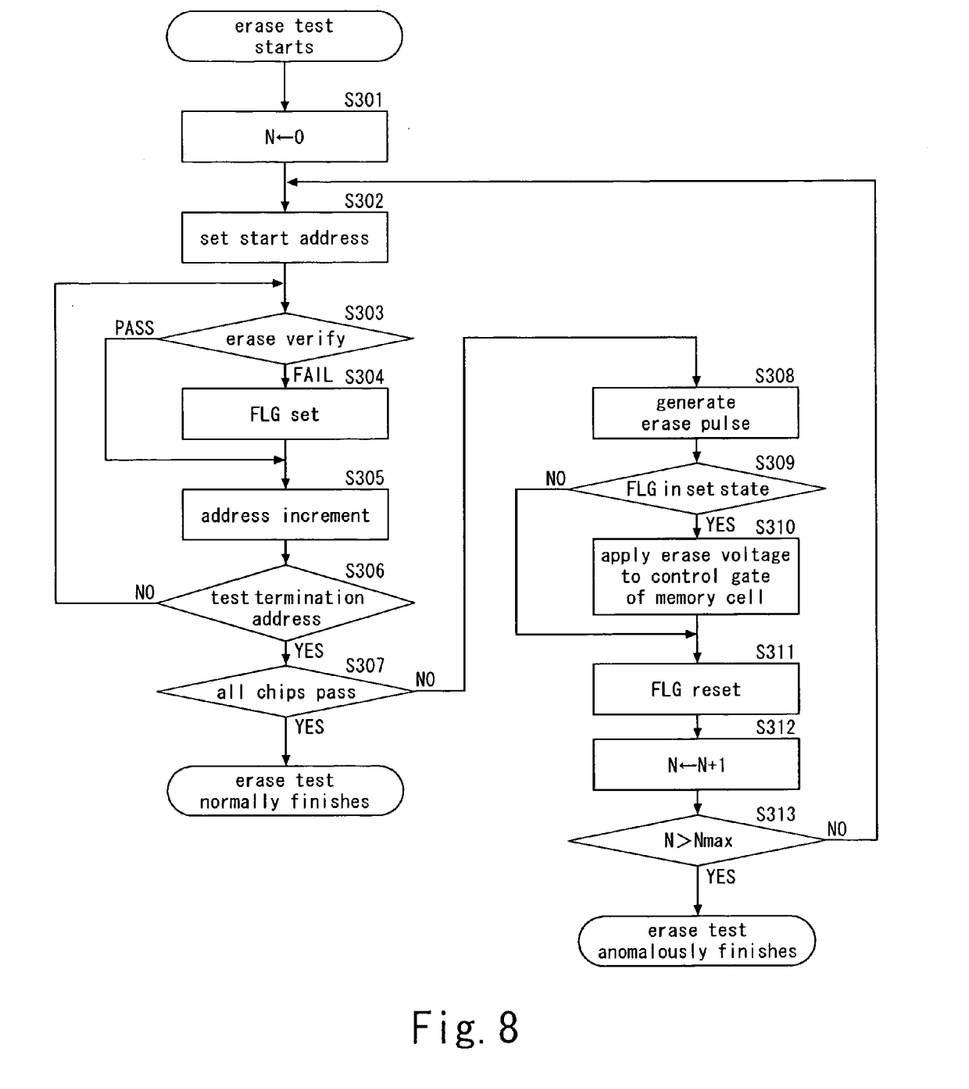
FIG. 8 is a flowchart showing an erase test method for the non-volatile semiconductor memory device in FIG. 7 (simultaneous testing on the plural devices).

FIG. 8 shows an erase test method for the non-volatile semiconductor memory device in FIG. 7 (simultaneous testing on the plural devices). In an erase test flow shown in FIG. 8, Steps S303, S304, and S309~S311 are operations executed in each of the non-volatile semiconductor memory devices MEMc, and steps other than Steps S303, S304, and S309~S311 are operations executed in an external testing apparatus.

At Step S301, a value of a variable N representing the number of erase times (the number of times an erase pulse is generated) is set to 0. Thereafter, the erase test shifts to Step S302.

At Step S302, an address supplied to an address input pin ADD is set to a start address of a memory cell array MCA. Thereafter, the erase test shifts to Step S303.

At Step S303, erase verify is executed. If the erase verify results in pass determination, the erase test skips Step S304 to shift to Step S305. If the erase verify results in fail determination, the erase test shifts to Step S304.

At Step S304, the flag circuit FLG is set. Thereafter, the erase test shifts to Step S305.

At Step S305, the address supplied to the address input pin ADD is incremented. Thereafter, the erase test shifts to Step S306.

At Step S306, it is determined whether or not the address supplied to the address input pin ADD matches a test termination address (an address after an end address of a memory cell array MCA is incremented). If the address supplied to the address input pin ADD matches the test termination address, the erase test shifts to Step S307. If the address supplied to the address input pin ADD does not match the test termination address, the erase test shifts to Step S303.

At Step S307, it is determined whether or not the erase verify for all addresses in all chips (non-volatile semiconductor memory devices MEMc) has resulted in pass determination. If the erase verify for all the addresses in all the chips has resulted in the pass determination, the erase test is normally finished. If the erase verify for at least one of the addresses in at least one of the chips has resulted in fail determination, the erase test shifts to Step S308.

At Step S308, the erase pulse to be supplied to a pulse input pin PLS is generated. Thereafter, the erase test shifts to Step S309.

At Step S309, it is determined whether or not the flag circuit FLG is in the set state. If the flag circuit FLG is in the set state, the erase test shifts to Step S310. If the flag circuit FLG is not in the set state (if the flag circuit FLG is in a reset state), the erase test skips Step S310 to shift to Step S311.

At Step S310, since the flag circuit FLG is in the set state, the row decoder RDECa applies an erase voltage (the internal voltage supplied from the internal voltage generator IVG) to control gates of memory cells MC, so that the erase operation of the memory cell array MCA is executed. Thereafter, the erase test shifts to Step S311.

At Step S311, the flag circuit FLG is reset. Thereafter, the erase test shifts to Step S312.

At Step S312, 1 is added to the value of the variable N. Thereafter, the erase test shifts to Step S313.

At Step S313, it is determined whether or not the value of the variable N has exceeded a maximum number of erase times Nmax. If the value of the variable N has exceeded the maximum number of erase times Nmax, the erase test is anomalously finished. If the value of the variable N has not exceeded the maximum number of erase times Nmax, the erase test shifts to Step S302.

The third embodiment as described above can also provide the same effects as those of the first embodiment.

The invention is not limited to the above embodiments and various modifications may be made without departing from the spirit and scope of the invention. Any improvement may be made in part or all of the components.

What is claimed is:

1. A non-volatile semiconductor memory device comprising:
    a memory cell array having a plurality of non-volatile memory cells that are electrically rewritable; and
    an operation control circuit controlling an operation of said memory cell array in accordance with an external instruction, wherein said operation control circuit comprises:
    a flag circuit that is set when erase incompletion is detected from any of said memory cells by an erase verify operation of said memory cell array; and
    an erase prohibition circuit that prohibits an erase operation to said memory cell array irrespective of said external instruction when said flag circuit is in a reset state.

2. The non-volatile semiconductor memory device according to claim 1, wherein
    said operation control circuit further comprises a command output circuit functioning as said erase prohibition circuit and outputting an erase command only when said flag circuit is in a set state, the erase command being to instruct the erase operation to said memory cell array.

3. The non-volatile semiconductor memory device according to claim 1, wherein
    said operation control circuit further comprises a voltage generating circuit functioning as said erase prohibition circuit and generating an erase voltage only when said flag circuit is in a set state, the erase voltage being to be used in the erase operation of said memory cell array.

4. The non-volatile semiconductor memory device according to claim 1, wherein
    said operation control circuit further comprises a voltage applying circuit functioning as said erase prohibition circuit and applying an erase voltage to control gates of said memory cells only when said flag circuit is in a set state.

5. The non-volatile semiconductor memory device according to claim 1, wherein
    said flag circuit is reset before the erase verify operation of said memory cell array is started.

6. An erase method for a non-volatile semiconductor memory device including a memory cell array having a plurality of non-volatile memory cells that are electrically rewritable, the method comprising the steps of
    prohibiting an erase operation to said memory cell array irrespective of an external instruction after erase completion is detected from all of said memory cells by an erase verify operation of said memory cell array.

7. The erase method for the non-volatile semiconductor memory device according to claim 6, wherein
    an erase command to instruct the erase operation to said memory cell array is outputted only when erase incompletion is detected from any of said memory cells by the erase verify operation of said memory cell array.

8. The erase method for the non-volatile semiconductor memory device according to claim 6, wherein an erase voltage to be used in the erase operation of said memory cell array is generated only when erase incompletion is detected from any of said memory cells by the erase verify operation of said memory cell array.

9. The erase method for the non-volatile semiconductor memory device according to claim 6, wherein an erase voltage is applied to control gates of said memory cells only when erase incompletion is detected from any of said memory cells by the erase verify operation of said memory cell array.

10. A test method for erasing a plurality of non-volatile semiconductor memory devices simultaneously, the non-volatile semiconductor memory devices each including a memory cell array having a plurality of non-volatile memory cells that are electrically rewritable, the method comprising the step of in each of said non-volatile semiconductor memory devices, prohibiting an erase operation to said memory cell array irrespective of an external instruction after erase completion is detected from all of said memory cells by an erase verify operation of said memory cell array.

* * * * *